United States Patent [19]
Caywood et al.

[11] Patent Number: 5,475,695
[45] Date of Patent: Dec. 12, 1995

[54] AUTOMATIC FAILURE ANALYSIS SYSTEM

[75] Inventors: John M. Caywood, Sunnyvale; Alan B. Helffrich, III, San Francisco; Yervant D. Lepejian, Palo Alto, all of Calif.

[73] Assignee: Semiconductor Diagnosis & Test Corporation, Milpitas, Calif.

[21] Appl. No.: 33,775

[22] Filed: Mar. 19, 1993

[51] Int. Cl.$^6$ ............................ G01R 31/28; G06F 11/00
[52] U.S. Cl. .............................. 371/27; 371/26; 364/579; 364/490; 364/468; 395/916
[58] Field of Search .......................... 371/27, 15.1, 16.1, 371/20.1, 21.1, 22.1, 22.4, 25.1, 26; 364/480, 481, 490, 578, 579; 395/916

[56] References Cited

U.S. PATENT DOCUMENTS

| | | | |
|---|---|---|---|
| 4,204,633 | 5/1980 | Goel | 371/27 |
| 4,228,537 | 10/1980 | Henckels et al. | 371/26 |
| 4,236,246 | 11/1980 | Skilling | 371/27 |
| 4,527,249 | 7/1985 | Van Brunt | 364/481 X |
| 4,727,545 | 2/1988 | Glackemeyer et al. | 364/578 X |
| 4,763,289 | 8/1988 | Barzilai et al. | 364/578 |
| 4,847,795 | 7/1989 | Baker et al. | 364/579 |
| 4,862,399 | 8/1989 | Freeman | 371/27 X |
| 4,903,267 | 2/1990 | Arai et al. | 371/27 |
| 4,964,125 | 10/1990 | Kim | 371/15.1 |
| 5,001,714 | 3/1991 | Stark et al. | 371/26 |
| 5,010,552 | 4/1991 | Dias et al. | 371/27 |
| 5,043,987 | 8/1991 | Stark et al. | 371/26 |
| 5,084,876 | 1/1992 | Welham et al. | 371/27 X |
| 5,090,014 | 2/1992 | Polich et al. | 371/16.1 |
| 5,161,158 | 11/1992 | Chakravarty et al. | 371/15.1 |
| 5,202,841 | 4/1993 | Tani | 364/490 X |
| 5,214,653 | 5/1993 | Elliott, Jr. et al. | 371/15.1 |
| 5,351,247 | 9/1994 | Dow et al. | 371/15.1 |

OTHER PUBLICATIONS

Ferguson et al., "A CMOS Fault Extractor for Inductive Fault Analysis", IEEE Trans. on CAD, vol. 7, No. 11 Nov. 1988, pp. 1181–1194.

Maly et al., "Systematic Characterization of Physical Defects for Fault Analysis of MOS IC Cells", 1984 IEEE International Test Conference, pp. 390–399.

Ferguson et al., "Test Pattern Generation for Realistic Bridge Faults in CMOS ICs", 1991 IEEE International Test Conference, pp. 492–499.

*Primary Examiner*—Ellis B. Ramirez
*Assistant Examiner*—Eric W. Stamber
*Attorney, Agent, or Firm*—Townsend and Townsend and Crew

[57] ABSTRACT

An automated system for identification of fabrication defects that lead to the failure of IC products. Design information of the product to be tested is analyzed to identify electrical node-to-node faults that can be caused by fabrication defects. The circuit is then analyzed to determine the electrical response to input patterns which result from the node-to-node faults. A matrix which relates failure responses to a multiplicity of input patterns as a function of process defects is constructed. This response matrix is used to identify the fabrication defect. In those cases in which the response matrix is degenerate, i.e. a set of output responses can arise from more than one fault, knowledge about the probability of occurrence of various defects is used to assign probabilities to the node-to-node faults which may generate the output response set. The system then takes knowledge of a specific IC test system and the response matrix to generate a set of test vectors to analyze a product. The system instructs the IC test system to apply these vectors to the device under test (DUT). The response of the DUT to the test vectors is used to identify the fabrication defect which caused the device to fail. Test results for a number of devices may be used to generate statistical measures which can be employed to improve the manufacturing process, thereby increasing yield.

9 Claims, 2 Drawing Sheets

AUTOMATIC FAILURE ANALYSIS SYSTEM

BACKGROUND OF THE INVENTION

The plants for the manufacture of integrated circuits have become very expensive. A modern wafer fabrication plant can cost in excess of $500 million. At the same time, there is a demand for inexpensive, complex integrated circuits. A critical factor in meeting this demand is the yield of good integrated circuits, i.e. the percentage of the integrated circuits that are fabricated that meet specifications published for the particular type of integrated circuit (IC). The current practice is for engineers to manually analyze failing circuits to ascertain the causes of the failing ICs.

These causes may be generally grouped under three headings: design errors; misprocessing which causes the parameters of basic circuit elements, such as resistors, capacitors, and transistors, to deviate from their design values; and random, localized process defects which cause individual ICs to fail. Examples of the localized process defects are (1) gate oxide defects which cause a transistor gate to short to the under lying substrate and (2) unopened contact vias which cause two nodes to fail to be connected. Design errors are usually identified early in the product life and once corrected are no longer of concern. Parametric failures are relatively easily monitored and detected by means of test patterns inserted onto the semiconductor wafer for this purpose.

Localized defects are much harder to identify. First the circuit fault that caused the failure must be located. Then the fabrication defect that caused the fault must be identified. Since localized defects arise from point contaminants or inhomogeneities in the processing environment and processing materials, they are always present to a certain extent. The goals of the yield improvement team are to identify which defects are most important in limiting yield and then to take appropriate action to reduce the occurrence of those defects.

The current practice is for an engineer to manually analyze failing units in order to identify the failure causes. This process is tedious and slow. For example, an engineer may only be able to analyze ten units per day. Unless one defect mechanism is overwhelming predominant, this is a statistically small sample. As a result, decisions made based on such a small sample may not attack the most important problems. Moreover, engineering analysis is usually only available on one shift, whereas the fabrication plants operate around the clock, seven days a week, in order to make maximum use of the huge capital investment. The consequence of this is that corrective action is delayed while waiting for the failures to be analyzed.

Computer technology has advanced to the point that the problem of analyzing failures arising from local faults to find the underlying defects has become practicable.

SUMMARY OF THE INVENTION

According to the invention, a system for the automatic identification of fabrication defects that lead to the failure of integrated circuit products is disclosed. This invention is composed of two parts, a knowledge generation part and a knowledge application part. In the knowledge generation portion of this system, design information of the product to be tested is analyzed to identify electrical node-to-node faults that can be caused by fabrication defects. The circuit is then analyzed to determine the electrical response to input patterns which result from the node-to-node faults. A matrix which relates failure responses to a multiplicity of input patterns as a function of process defects is constructed. This response matrix is used later to identify the fabrication defect. In those cases in which the response matrix is degenerate, i.e. a set of output responses can arise from more than one fault, knowledge about the probability of occurrence of various defects is used to assign probabilities to the node-to-node faults which may generate the output response set. The knowledge application portion of the system makes use of the response matrix to analyze specific integrated circuits. This portion of the system takes knowledge of a specific IC test system and the response matrix to generate a set of test vectors which will be used to analyze a product. Having generated the appropriate set of test vectors, the system is able to instruct the IC test system to apply these vectors to the device under test (DUT). The response of the DUT to the test vectors is used to identify the fabrication fault which caused this device to fail. The system is capable of repeating the test and analysis sequence rapidly on a number of parts and using the results of testing many units to generate statistical measures which can be employed by engineers to improve the manufacturing process in order to decrease the percentage of defective units.

A further understanding of the nature and advantages of the present invention may be realized by reference to the remaining portions of the specification and the drawings.

DESCRIPTION OF THE PREFERRED EMBODIMENT

The invention described here is particularly suited to ICs for which the failures are dominated by faults in a small number of distinct cells which are repeated to form large arrays. The reason that this invention is particularly suited for such arrays is the computational power needed for the analysis described herein. However, as computers become more powerful, the range of circuits to which this invention can be reasonably applied will expand. Memories are the archetype of large arrays although large programmable logic devices (PLDs) and field programmable gate arrays (FPGAs) also may fit this description. Regular arrays which are part of a larger circuit may also be used as a diagnostic tool for the complete circuit if they contain technology features similar to the arrays described above. An example might be a cache RAM on a microprocessor chip. For the sake of concreteness, a system for the analysis of memories is described with the understanding that other types of ICs may also be suitable for analysis with the system described here.

In the description which follows the word "defect" will be taken to mean a physical flaw resulting from the manufacturing process, such as a pinhole through a gate oxide, or a hole in a metal line. The word "fault" will be taken to be the electrical alteration in the circuit topology resulting from the "defect" such as the gate and the substrate being shorted together. The word "failure" will be taken to mean an errant response of the IC to a stimuli or an IC that provides one or more erroneous output responses.

Figure 1:
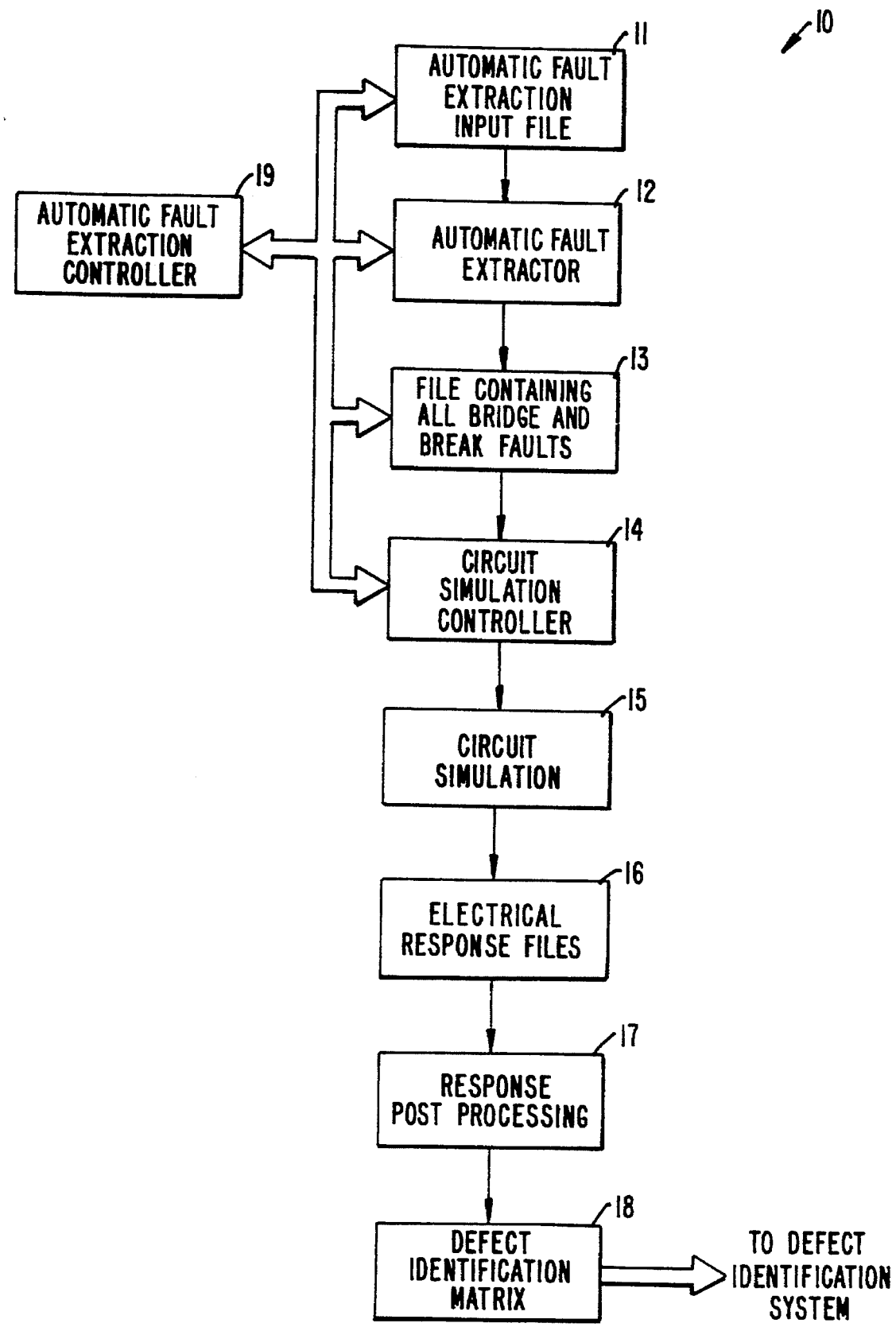
FIG. 1 is a block diagram illustrating the knowledge generation portion of the invention.

The invention is most easily understood by reference to FIG. 1, which illustrates the knowledge generation portion of the invention. A number of data files are needed as the basic inputs to the system. These are included in box 11 in FIG. 1. Among the required files are the process/layer file, the data base which describes the topology of each layer, the circuit schematics for the cells which interface directly to the repeated cells, the layout-versus-schematic (LVS) file, the device architecture description, and a defect matrix file.

The process/layer file describes the order in which the various layers are formed and whether a layer is conducting or insulating. It also indicates if a transistor is formed by a combination of layers. There are several formats in which the process/layer file could be presented to the system. If the user has already created such a file for use by a commercial design tool, such as Dracula® (a registered trademark of Cadence Design), this format should be accepted to avoid repetitive effort. If the user has not created such a file, then a graphical user interface (GUI) is provided to create the file.

GDS II is an industry standard in which design data bases are sent to mask shops to make the photo masks used to define the layers. This system accepts GDS II formatted topology descriptions because this is the common format in which all circuits are available.

The schematics are needed for the circuits which interface directly to the repeated cells so that the analog electrical behavior of the repeated cells can be accurately simulated as will be described in more detail later.

The defect matrix defines the probability of both interlayer and intralayer defects as a function of defect size. This matrix is needed to calculate probabilities of faults later, so there must be a default matrix supplied by the system which is used if the user cannot or does not choose to supply the matrix for his specific process.

Information from the layer topology data base, the interface cell schematics, the layout-versus-schematic file, and the device architecture are combined to form the information needed for automatic fault extraction 12 (AFE). The input to the AFE is the names of the basic repeated cells to be analyzed, the number of memory bits in the basic cells, and the number of times these cells are repeated in the array. The AFE controller selects the basic cells one at a time and calls the automatic fault extraction 12 to analyze these cells.

At the heart of the AFE is a technique called inductive fault analysis, IFA. IFA is a recently developed technique which examines a layout topology and assigns probabilities to faults between the electrical nodes in the circuit. For example, the probability of a fault which shorted two adjacent metal lines would be proportional to the distance over which the lines were adjacent, inversely proportional to the spacing between the lines and proportional to the density of bridging defect at least as large as the line spacing. This technique is described in the "Systematic Characterization of Physical Defects for Fault Analysis of MOS IC Cells," by Maly, Ferguson, and Shen, herein incorporated by reference. Inductive fault analysis is also described in "A CMOS Fault Extractor for Inductive Fault Analysis," by Ferguson and Shen, herein incorporated by reference. The result of this analysis is a list connecting layout defects to schematic faults 113.

The net lists 13 generated by the automatic fault extractor 12 are not in a form that is directly usable by a circuit simulation program to find the response of the array to any single fault. The circuit simulation controller 14 prepares a set of schematic net lists which are suitable for this use. These net lists are combined with more information needed for further analysis. The additional information needed includes the dynamic circuit description, the device model parameters for the circuit elements, and a description of any special test modes which are available on the IC under examination.

The dynamic circuit description is composed of two portions. One portion is simply the data sheet description which gives the specified output for various input stimuli. The other portion is the internal timings for the lines which drive those circuits which interface directly to the array. Examples of the lines which interface directly to the array are the row decoder, the column bias and multiplexing circuitry, and the sense amplifier. Examples of the internal timing signals required for the case of a dynamic RAM are the precharge, equalization, and sense strobe signals to the sense amplifier.

The device parameters are needed for the analog circuit simulation which will be described shortly. An example of a parameter which is typically used in the circuit simulation is electron mobility and its dependence upon temperature, lateral electric field, and vertical electric field.

Many integrated circuits have special test modes which may not be described on the data sheet, but which allow special access to the array. An example is that some EPROMs have a special mode which allows the word line voltage to be varied independently from the rest of the circuit. Because these special modes may provide information which is key to identifying a fault, it is critical to know of any special modes which exist.

The circuit simulation controller 14 then takes each basic schematic and creates a number of derivative schematics, one for each fault. The electrical response of each of these schematics is simulated for each possible condition (e.g. read, write, and special test modes) and for a number of combination of signals (e.g., write a checkerboard pattern, or march a "1" through a background of "0"s). There are a number of analog circuit simulators which could be used for the simulation 15. The best known is SPICE, which was developed by the University of California at Berkeley and is available commercially from several companies. Fortunately, because of the array symmetries, the number of useful combinations of signals is rather small, usually less than twenty.

Because the defects may be of several different sizes, it may be necessary to simulate for several different values of resistances or transistors in some faults. For example, gate oxide defects that result in a "gate-to substrate short" might be best represented by resistors between gate and substrate of differing sizes depending upon the size of the defect.

The result of all of this simulation is the electrical response of the circuit containing various faults 16. The response post processing, 17, can construct a classification connecting electrical failures (response patterns to stimuli) matrix connecting electrical failures (response patterns to stimuli) to faults. Finding the irreducible representation of this matrix will put it in semi-diagonal form with all of the faults that create unique response patterns on the diagonal and those faults that share response patterns in square sub-matrices on the diagonal. At this point any redundant tests are removed (i.e. those which engender the same response for all faults) and the non-unique faults (i.e. those that have the same electrical response to all patterns) are summed. The result of all of this is a pattern response vs. defect matrix.

The program described above is obviously computationally intensive. However, it need only be performed once for each IC design. Once the classification matrix is derived it can be used to analyze as many units as is desired without recalculating the matrix. Fortunately, work station class computers have been developed which can do the calculations necessary to define the classification matrix in a reasonable time.

Figure 2:
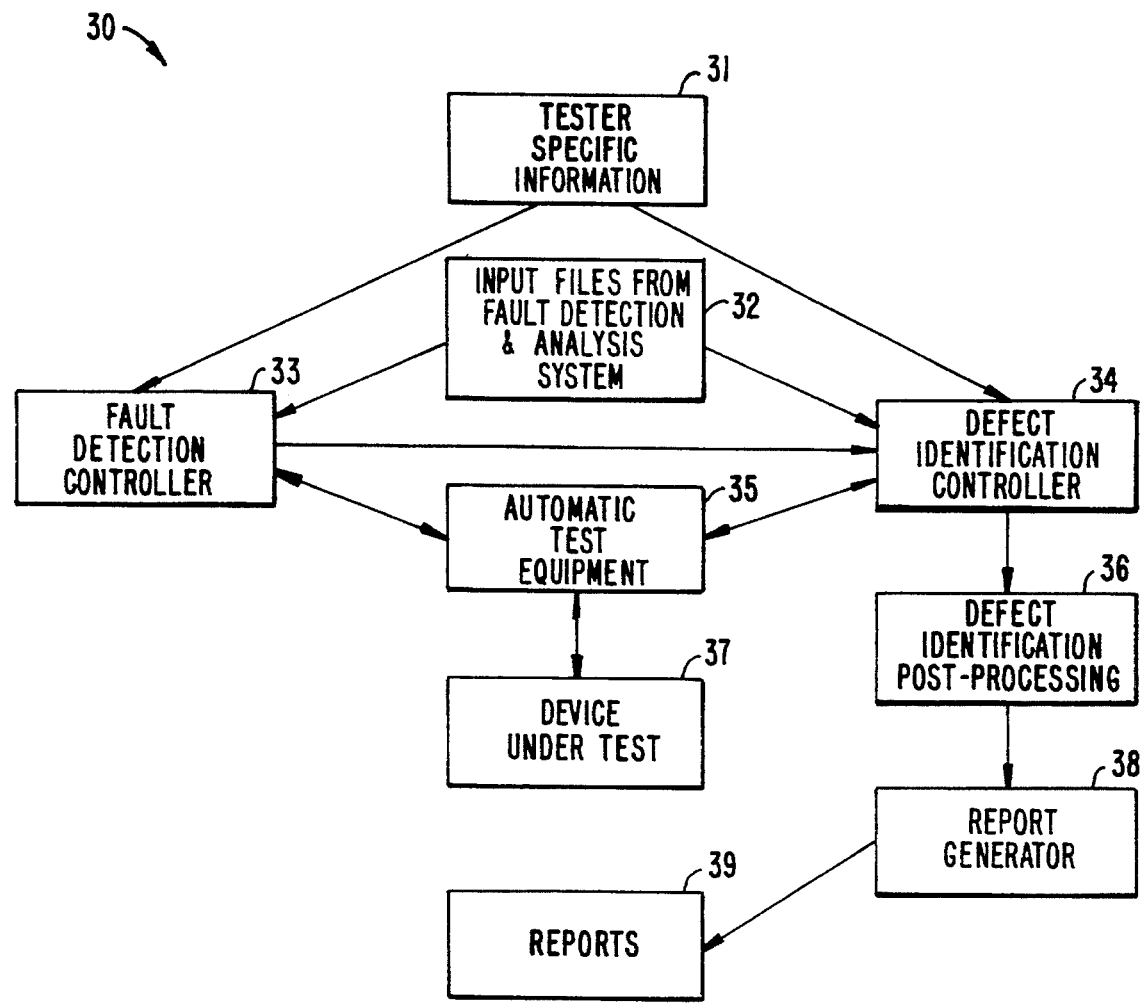
FIG. 2 is a block diagram indicating the flow of information in the defect identification section.

Once the classification matrix is calculated, the system is ready for defect identification. Shown in FIG. 2 is a block diagram of the defect identification portion 30 of the invention. The additional information required beyond that used by the portion of the system illustrated by FIG. 1 is that information which is specific to the tester to be used for the defect detection testing. This includes the tester capabilities and the test description language and is shown as item 31. A set of test vectors is supplied with the detection system which are specific to the type of memory to be tested. There is also the ability to create custom tests to handle device specific items such as the special test modes mentioned earlier. The generation of test patterns is discussed in "Test Pattern Generation for Realistic Bridge Faults in CMOS ICs," by Ferguson and Larrabee, herein incorporated by reference.

The fault detection controller 33 combines information from the output of the defect identification matrix 18 with information from the circuit simulation controller 14 to select the test vectors to use to detect the faults and to classify the failure modes. It instructs the automatic test equipment 35 to execute the test vectors and records the responses. From the responses, a bit map of the failing bits is generated. This map is used to classify the device under test 37 (DUT) by mode (e.g. good, column failure, row failure, single bit failure, etc.).

The output bit map and mode classification is passed to the defect identification controller 34. This controller runs the tests necessary to generate the inputs to the pattern response vs. defect matrix. There are two possible approaches to selecting the tests to be run. An expert system can be used which will minimize the number of tests needed to make a unique identification. The other approach is to run all of the tests used in the defect identification matrix 18. The advantage of the expert system approach is that it minimizes test time. The disadvantage is that the expert system must be trained which takes engineering time to set it up. The advantage of the exhaustive approach is that it requires no set up time. If the address space has been reduced sufficiently in the mode classification, the tests that the defect identification controller 34 needs may run so fast that there is no practical gain to the expert system. For some device types (e.g. EEPROMs), the ID tests may run slowly enough to make an expert system worth while. Both approaches can be supplied with the user being able to select the better. For example, one approach would be to use exhaustion as a first choice and add the complication of the expert system only if exhaustion proved to be too slow.

The defect identification controller 34 provides the identification of the defect or possible defects and the bit map location of the defect. Post processing 36 is done on this information to refine the solution found. For example, the test result might say that a particular failure is a result of either a gate to bit line diffusion short or a metal bit line to poly gate short. However, if it is known that the poly gate over bit line diffusion edge is twice as long as the metal to poly edge and that the probability of a gate oxide defect is ten times that of an interlevel dielectric defect, the conclusion could be drawn that the probability is 95% that the failure results from a gate oxide defect and 5% that it results from an interlayer dielectric defect. Such probabilities are especially useful when the defect distributions are computed for a number of units.

Another bit of post processing done at this juncture is to give the absolute location of the defect on a die. This is useful if someone wants to use a computer controlled prober or focused ion beam (FIB) system to physically verify the reported diagnosis.

The results of the analysis are stored in a data base for further processing. After a number of units have been analyzed, for example by testing all of the failing units on several wafers, statistical reports 39 can be prepared giving useful information such as defects in ranked order of occurrence, defects causing single bit failures in ranked order of occurrence, failure modes in ranked order of occurrence, and a wafer map showing the frequency of the failures by wafer location. This processing is the function of the report generator 38. The information in the data base can be linked to other engineering data bases for further analysis.

While the invention has been particularly shown and described with reference to specific embodiments thereof, it will be understood by those skilled in the art that the foregoing and other changes in the form and details may be made therein without departing from the spirit or scope of the invention.

What is claimed is:

1. A method for identifying frequently occurring fabrication defects for an integrated circuit design and a fabrication process, the method comprising the steps of:

(1) analyzing the integrated circuit design and the fabrication process to identify a plurality of electrical faults that can be caused by fabrication defects;

(2) analyzing the integrated circuit design to determine a plurality of electrical responses to a plurality of input patterns, the electrical responses corresponding to the electrical faults;

(3) generating a response matrix relating the electrical responses to the input patterns as a function of the fabrication defects;

(4) generating a set of test vectors using the response matrix and parameters of a specific integrated circuit test system;

(5) applying the test vectors to an integrated circuit having the integrated circuit design;

(6) recording responses of the integrated circuit to the test vectors;

(7) analyzing the responses of the integrated circuit to the test vectors using the response matrix to identify particular fabrication defects;

(8) repeating steps (5) through (7) for other integrated circuits having the integrated circuit design;

(9) storing failure information related to the particular fabrication defects identified in steps (1) through (8) in a data base;

(10) generating statistical failure information using the failure information; and

(11) identifying frequently occurring fabrication defects from among the particular fabrication defects using the statistical failure information, the frequently occurring fabrication defects having a frequency above a threshold level.

2. The method of claim 1 wherein the step of generating a response matrix comprises assigning a probability to each of a first plurality of fabrication defects where a particular set of electrical responses arises from each of the first plurality of fabrication defects.

3. A method for identifying frequently occurring fabrication defects for an integrated circuit design and a fabrication process, the method comprising the steps of:

(1) generating a response matrix for the integrated circuit design which relates electrical responses of an integrated circuit designed according to the integrated circuit design to input stimuli patterns as a function of fabrication defects;

(2) identifying particular fabrication defects in a plurality of integrated circuits having the integrated circuit design and fabricated by the fabrication process using the response matrix;

(3) storing failure information related to the particular fabrication defects identified in step (2) in a data base;

(4) generating statistical failure information using the failure information; and (5) identifying frequently occurring fabrication defects from among the particular fabrication defects using the statistical failure information, the frequently occurring fabrication defects having a frequency above a threshold level.

4. The method of claim 3 wherein the step of generating a response matrix comprises assigning a probability to each of a first plurality of fabrication defects where a particular set of electrical responses arises from each of the first plurality of fabrication defects.

5. A method for identifying frequently occurring fabrication defects for an integrated circuit design and a fabrication process, the method comprising the steps of:

(1) identifying fabrication defects in a plurality of integrated circuits having the integrated circuit design and fabricated by the fabrication process;

(2) storing failure information related to the fabrication defects identified in step (1) in a data base;

(3) generating statistical failure information using the failure information; and (4) identifying frequently occurring fabrication defects using the statistical failure information, the frequently occurring fabrication defects having a frequency above a threshold level.

6. A method for identifying frequently occurring fabrication defects for an integrated circuit design and a fabrication process, the method comprising the steps of:

(1) analyzing electrical responses of a plurality of integrated circuits having the integrated circuit design to a set of test vectors using a response matrix to identify particular fabrication defects, the response matrix relating the electrical responses to a plurality of input patterns as a function of the fabrication defects;

(2) storing failure information related to the particular fabrication defects identified in a data base;

(3) generating statistical failure information using the failure information; and (4) identifying frequently occurring fabrication defects from among the particular fabrication defects using the statistical failure information, the frequently occurring fabrication defects having a frequency above a threshold level.

7. A method for generating a response matrix for an integrated circuit design and a fabrication process, the method comprising the steps of:

(1) analyzing the integrated circuit design and the fabrication process to identify a plurality of electrical faults that can be caused by fabrication defects;

(2) analyzing the integrated circuit design to determine a plurality of electrical responses to a plurality of input patterns, the electrical responses corresponding to the electrical faults; and (3) generating a response matrix relating the electrical responses to the input patterns as a function of the fabrication defects.

8. The method of claim 7 further comprising the step of:

(4) generating a set of test vectors using the response matrix and parameters of a specific integrated circuit test system.

9. An apparatus for identifying frequently occurring fabrication defects for an integrated circuit design and a fabrication process, comprising:

means for generating a response matrix for the integrated circuit design which relates electrical responses of an integrated circuit designed according to the integrated circuit design to input stimuli patterns as a function of fabrication defects;

first means for identifying particular fabrication defects in a plurality of integrated circuits having the integrated circuit design and fabricated by the fabrication process using the response matrix;

means for storing failure information related to the particular fabrication defects identified by the first identifying means in a data base;

means for generating statistical failure information using the failure information; and second means for identifying frequently occurring fabrication defects from among the particular fabrication defects using the statistical failure information, the frequently occurring fabrication defects having a frequency above a threshold level.

* * * * *